(12) United States Patent
Kiyotoshi

(10) Patent No.: US 7,855,116 B2
(45) Date of Patent: Dec. 21, 2010

(54) NONVOLATILE SEMICONDUCTOR MEMORY DEVICE AND MANUFACTURING METHOD THEREOF

(75) Inventor: Masahiro Kiyotoshi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 12/209,116

(22) Filed: Sep. 11, 2008

(65) Prior Publication Data
US 2009/0072323 A1 Mar. 19, 2009

(30) Foreign Application Priority Data
Sep. 14, 2007 (JP) ............................. 2007-239767

(51) Int. Cl.
H01L 21/8234 (2006.01)
(52) U.S. Cl. .................. 438/275; 438/294; 438/295; 438/296; 438/359; 438/404; 438/412; 257/392; 257/501; 257/506; 257/374; 257/540; 257/E21.54; 257/E21.644; 257/E21.206; 257/E21.628; 257/E21.63; 257/E27.06; 257/E29.02
(58) Field of Classification Search ................. 438/275
See application file for complete search history.

(56) References Cited

U.S. PATENT DOCUMENTS

| | | | |
|---|---|---|---|
| 5,174,933 A | 12/1992 | Toh et al. | |
| 6,706,646 B1 | 3/2004 | Lee et al. | |
| 7,105,397 B2 | 9/2006 | Hieda et al. | |
| 7,338,860 B2 | 3/2008 | Kwon | |
| 7,416,987 B2 | 8/2008 | Hieda et al. | |
| 2004/0058499 A1 | 3/2004 | Ishitsuka et al. | |
| 2005/0093047 A1 | 5/2005 | Goda et al. | |
| 2005/0106822 A1* | 5/2005 | Lee et al. | 438/294 |
| 2006/0134845 A1* | 6/2006 | Pham et al. | 438/200 |
| 2006/0270170 A1 | 11/2006 | Arisumi et al. | |
| 2008/0182381 A1 | 7/2008 | Kiyotoshi | |

FOREIGN PATENT DOCUMENTS

| | | |
|---|---|---|
| JP | 3178412 | 4/2001 |
| JP | 2001-319927 | 11/2001 |

(Continued)

OTHER PUBLICATIONS

Heo et al. "Void free and low stress shallow trench isolation technology using P-SOG for sub 0.1 um device", Symposium on VLSI technology, pp. 132-133, 2002.*

(Continued)

*Primary Examiner*—Chares D Garber
*Assistant Examiner*—Yasser A Abdelaziez
(74) *Attorney, Agent, or Firm*—Finnegan, Henderson, Farabow, Garrett & Dunner, L.L.P.

(57) ABSTRACT

In a nonvolatile semiconductor memory device which has a nonvolatile memory cell portion, a low-voltage operating circuit portion of a peripheral circuit region and a high-voltage operating circuit portion of the peripheral circuit region formed on a substrate and in which elements of the above portions are isolated from one another by filling insulating films, the upper surface of the filling insulating films in the high-voltage operating circuit portion lies above the surface of the substrate and the upper surface of at least part of the filling insulating films in the low-voltage operating circuit portion is pulled back to a portion lower than the surface of the substrate.

7 Claims, 12 Drawing Sheets

FOREIGN PATENT DOCUMENTS

| | | |
|---|---|---|
| JP | 2004-039902 | 2/2004 |
| JP | 2004-228557 | 8/2004 |
| JP | 2005-353892 | 12/2005 |
| JP | 2006-332442 | 12/2006 |

OTHER PUBLICATIONS

Notice of Rejection dated Nov. 15, 2009, issued by the Japanese Patent Office in a counterpart application No. 2007-239767 (3 pages).

* cited by examiner

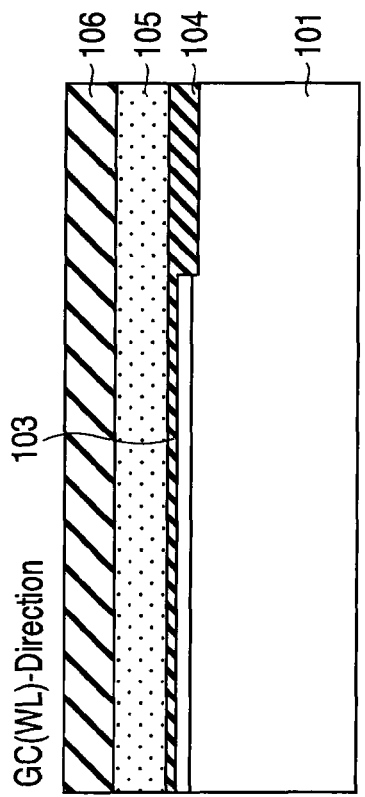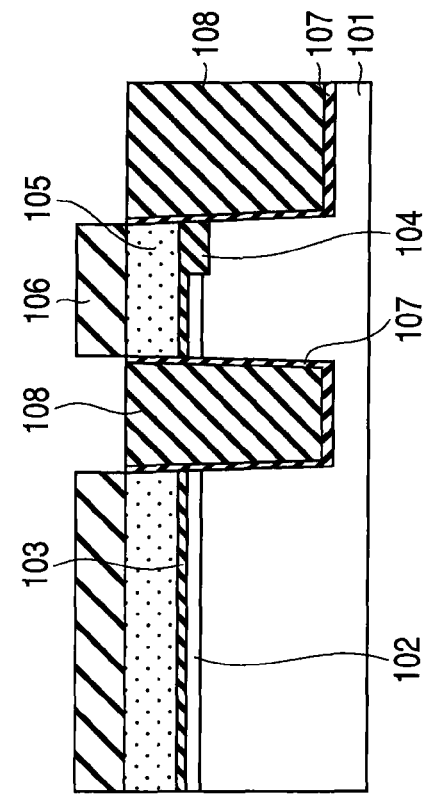
FIG. 1A / FIG. 1B / FIG. 2A / FIG. 2B

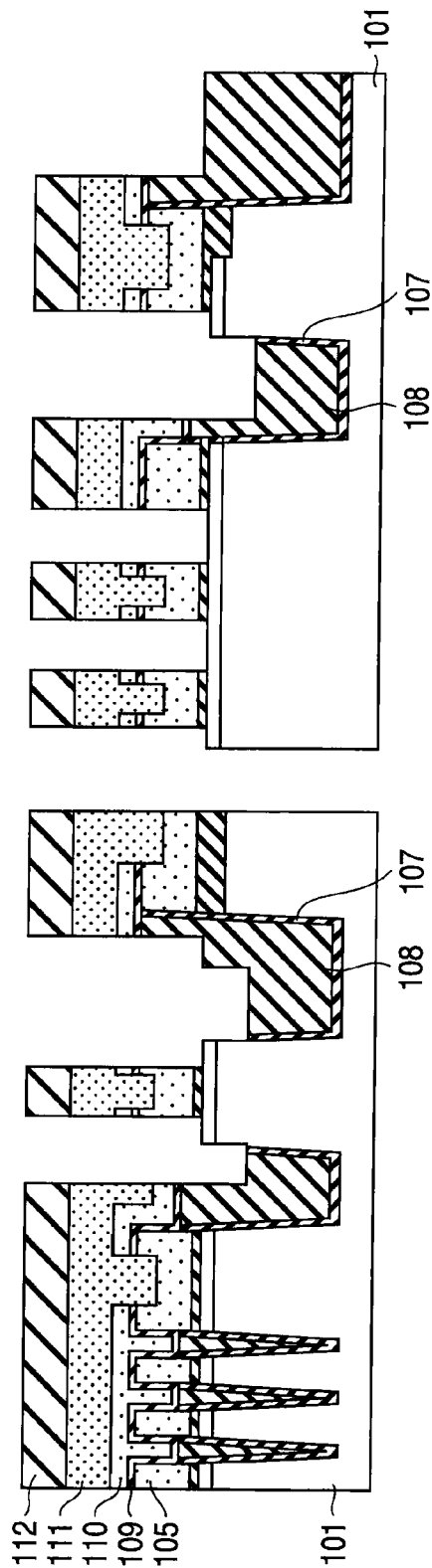
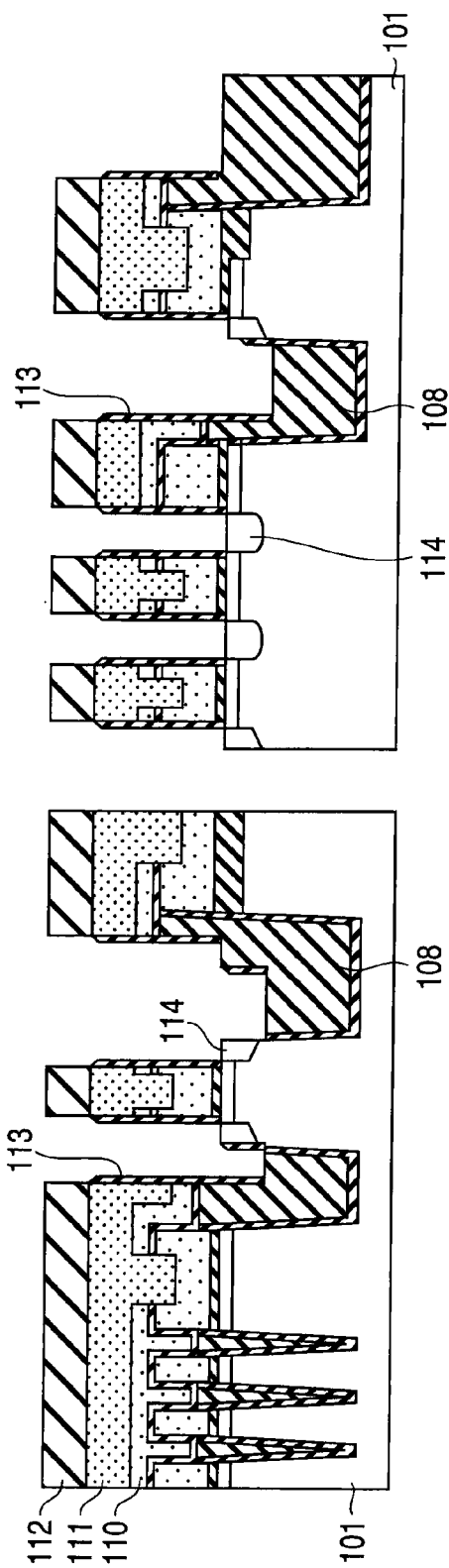
FIG. 5A  FIG. 5B  FIG. 6A  FIG. 6B

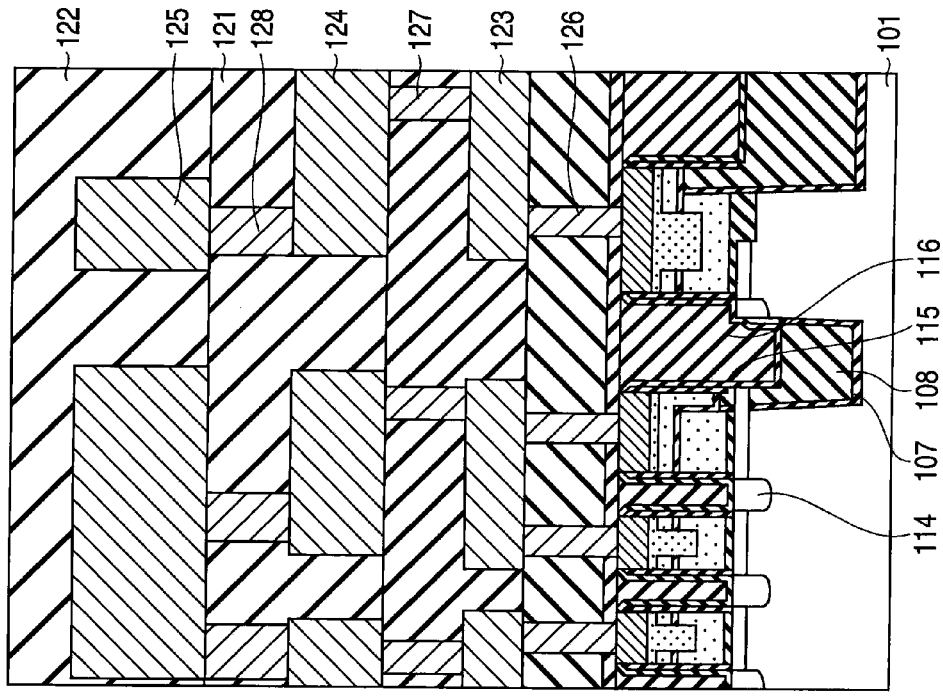
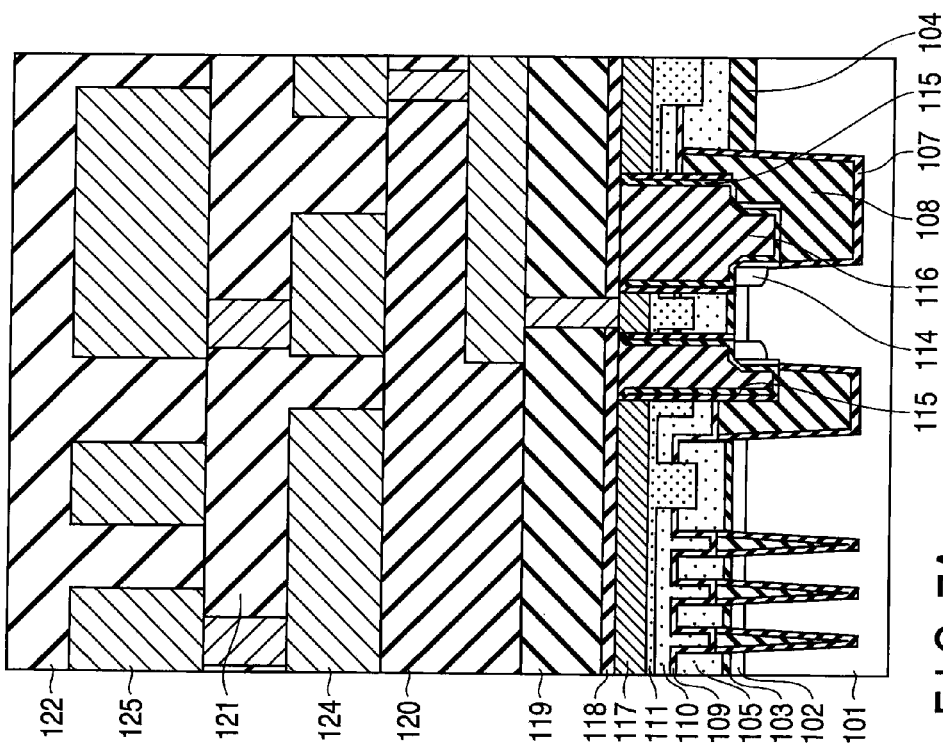

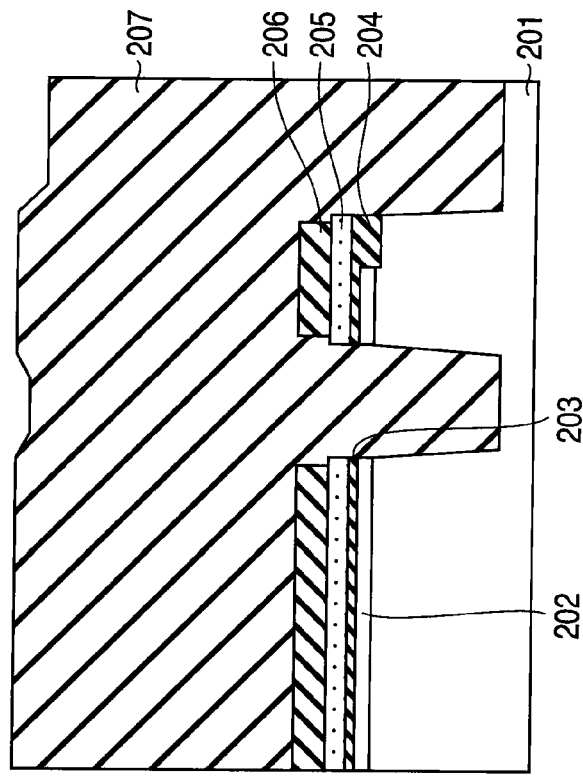
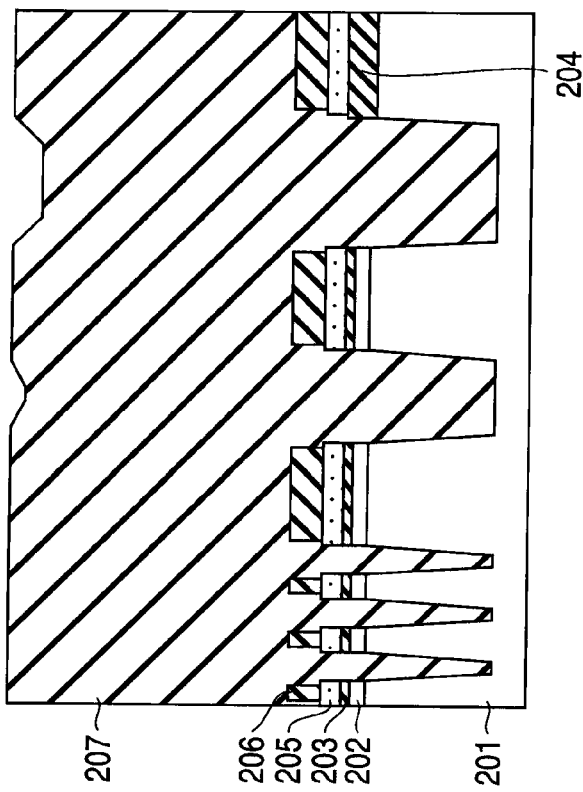
FIG. 9A
FIG. 9B

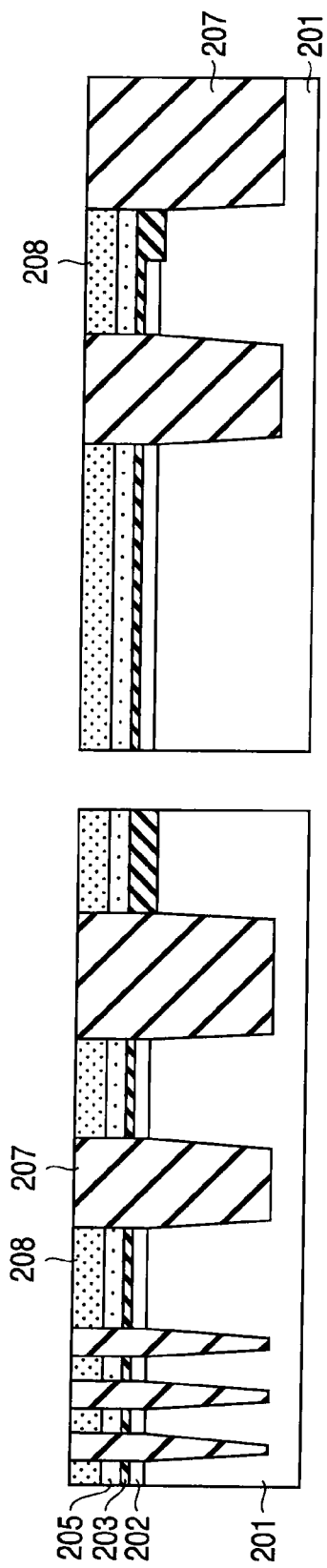
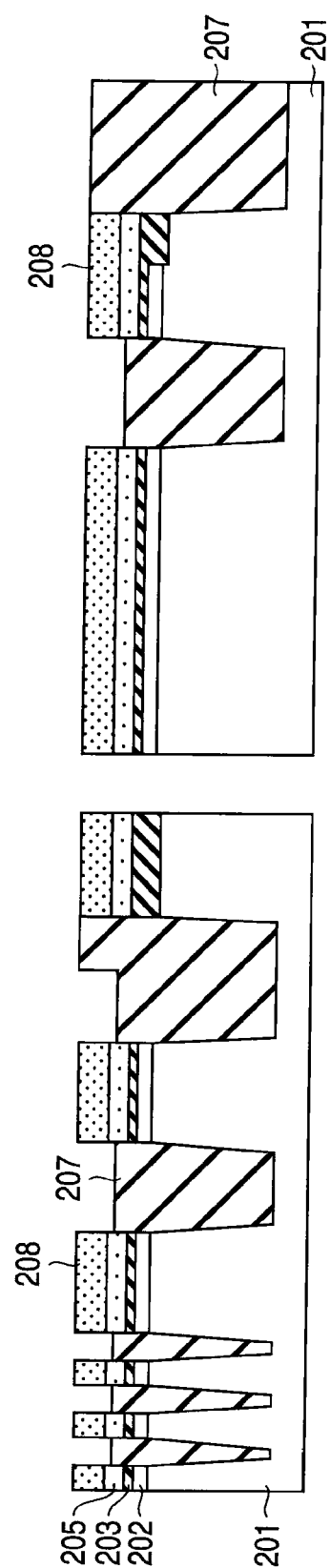
FIG. 10A  FIG. 10B  FIG. 11A  FIG. 11B

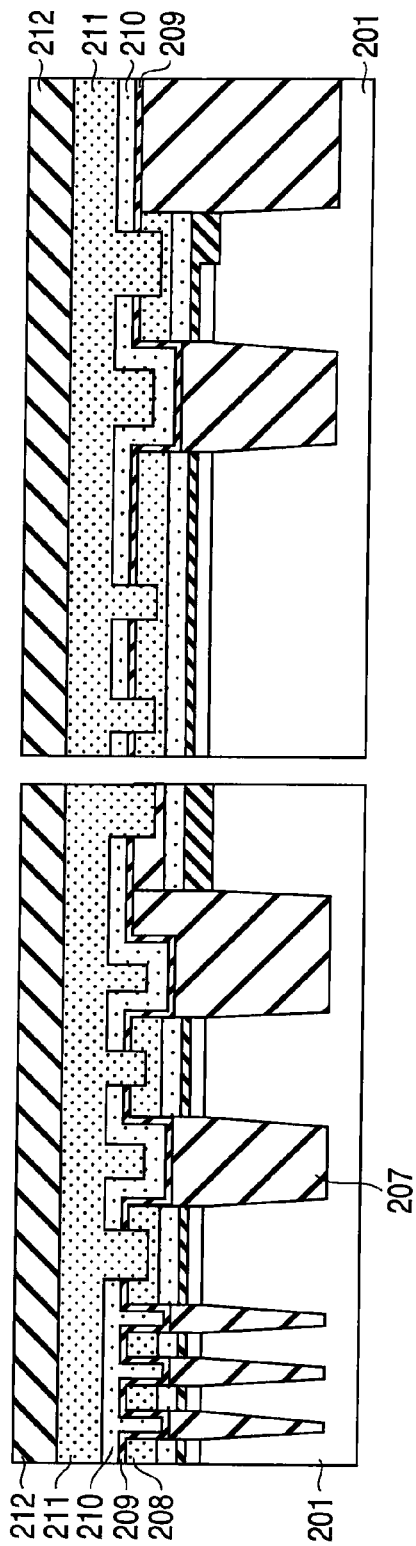
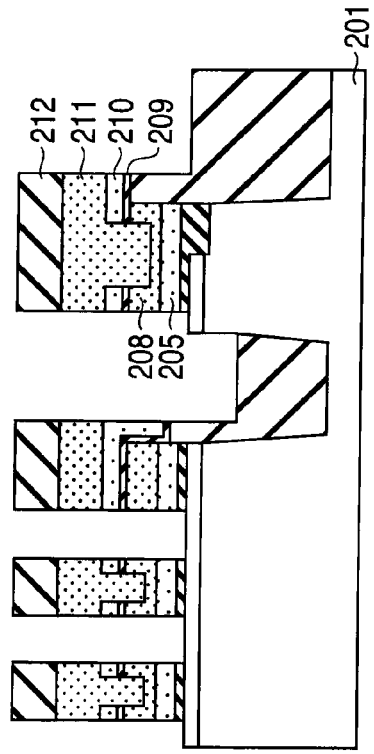
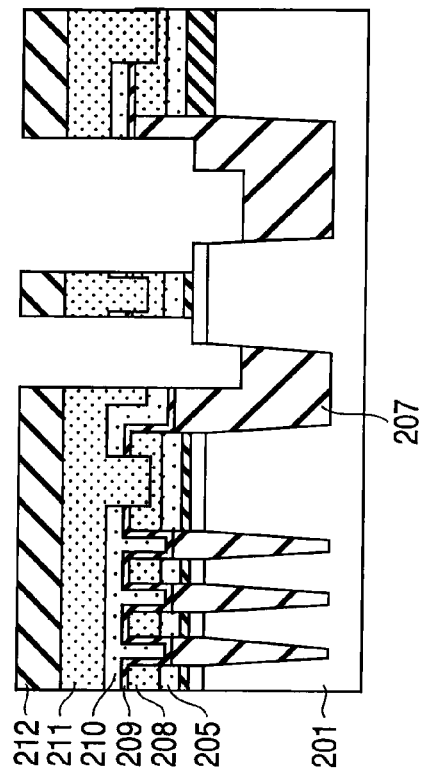

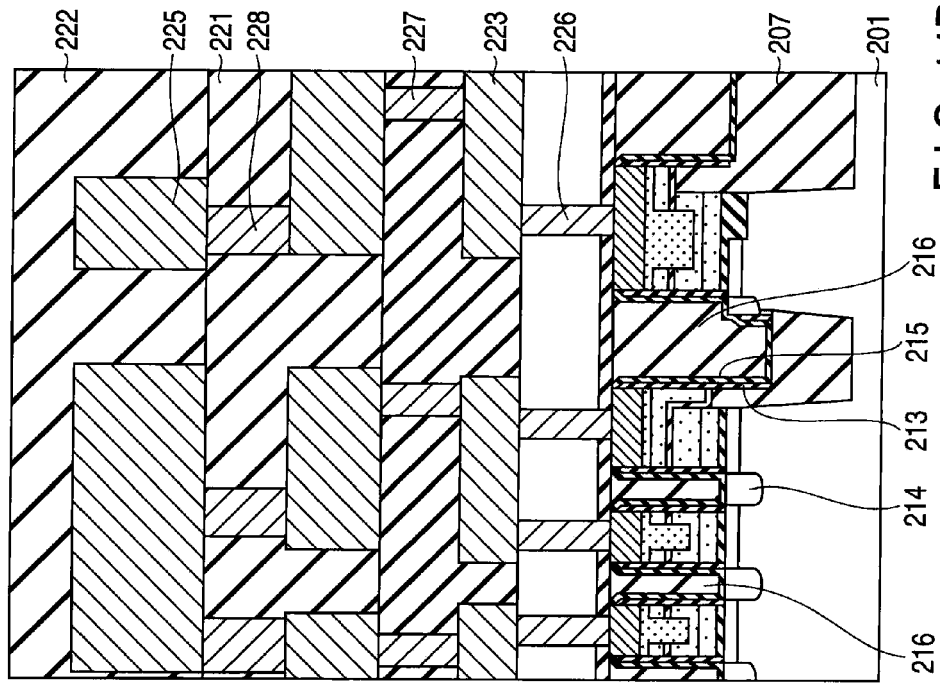
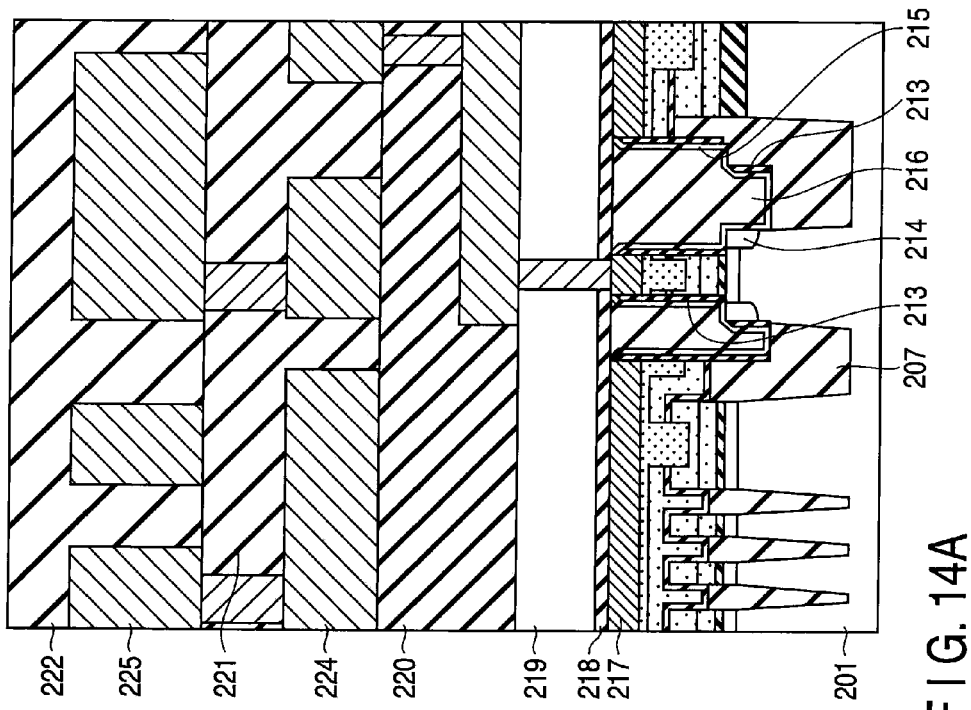
FIG. 14A
FIG. 14B

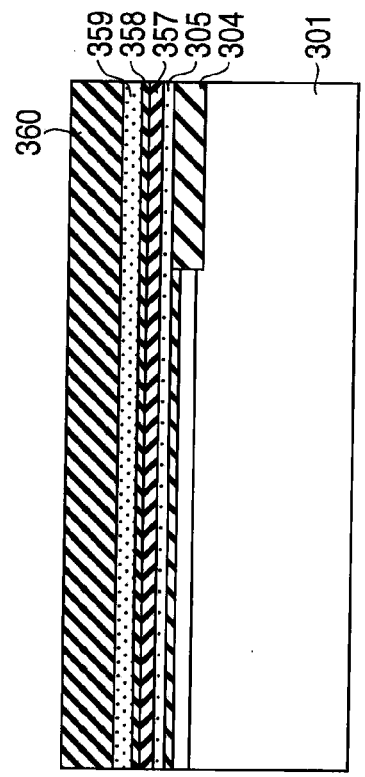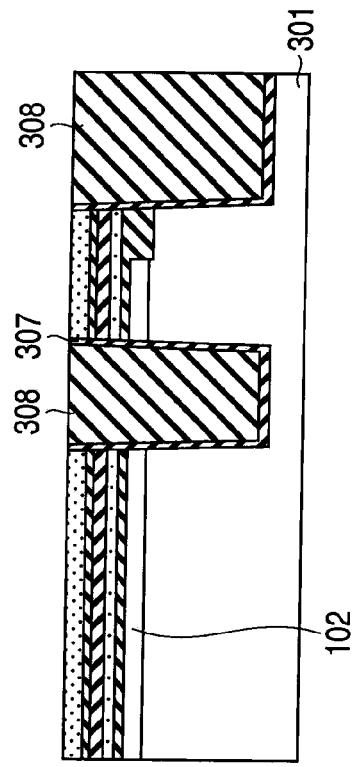
FIG. 15A  FIG. 15B
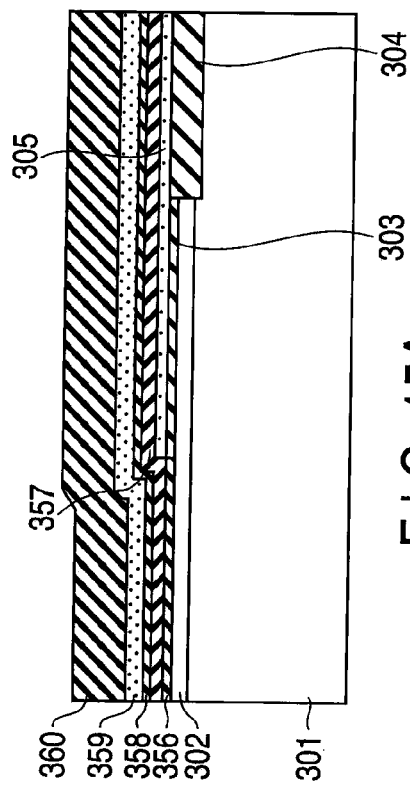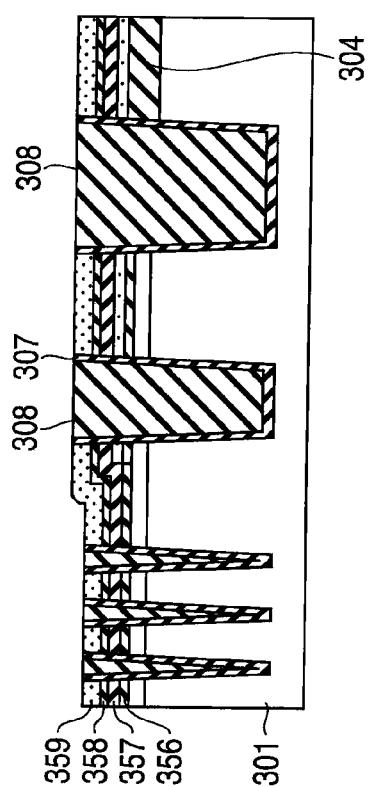
FIG. 16A  FIG. 16B

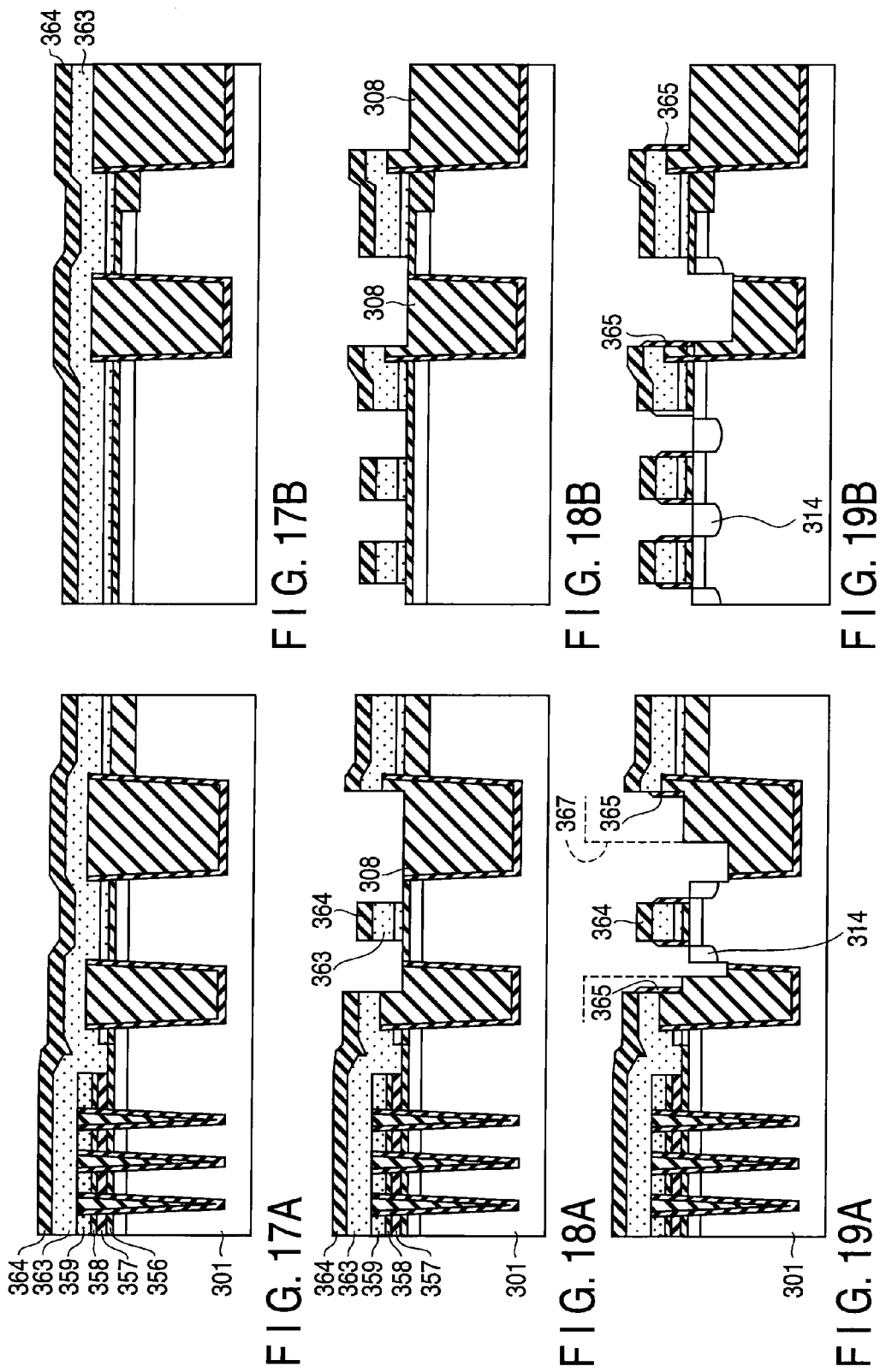

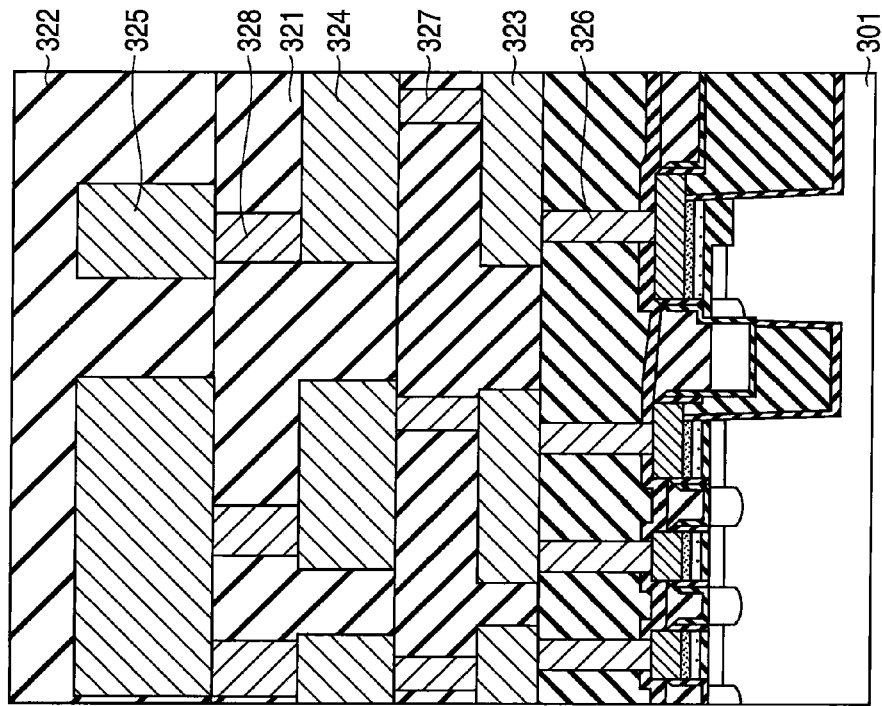
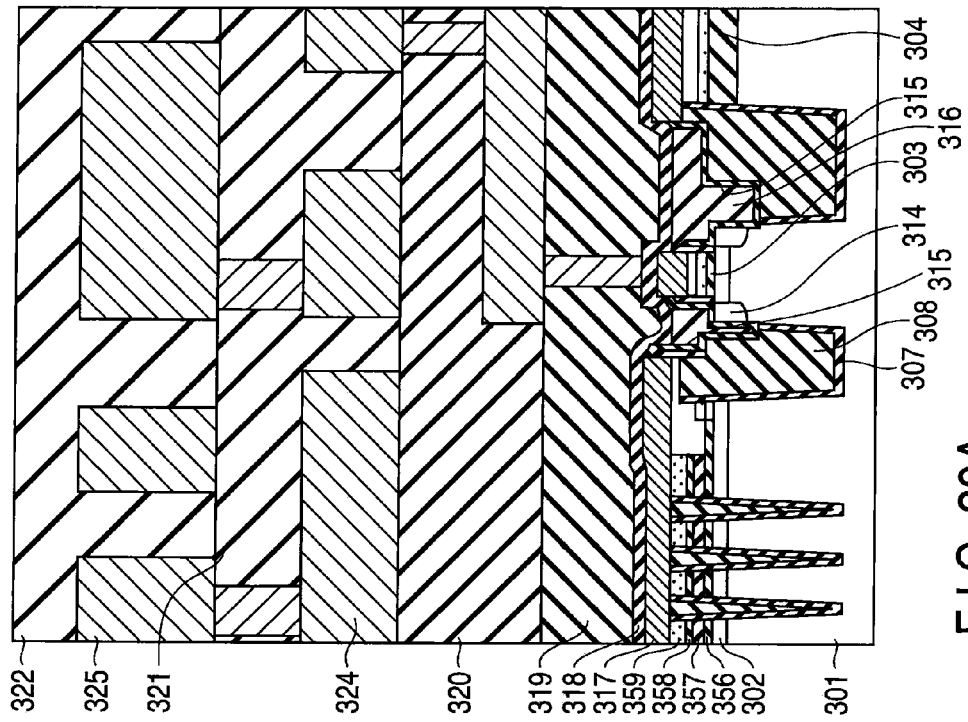
FIG. 20A
FIG. 20B

NONVOLATILE SEMICONDUCTOR MEMORY DEVICE AND MANUFACTURING METHOD THEREOF

CROSS-REFERENCE TO RELATED APPLICATIONS

This application is based upon and claims the benefit of priority from prior Japanese Patent Application No. 2007-239767, filed Sep. 14, 2007, the entire contents of which are incorporated herein by reference.

BACKGROUND OF THE INVENTION

1. Field of the Invention

This invention relates to a nonvolatile semiconductor memory device having a shallow trench isolation (STI) structure and a manufacturing method thereof, and more particularly to a nonvolatile semiconductor memory device in which an insulating film having fluidity is used as an STI filling material, and a manufacturing method thereof.

2. Description of the Related Art

Recently, flash memories are increasingly scaled down and realized higher bit density. Due to the rapid scale-down of the device, it becomes also important to shrink cell transistors and shrink element isolation regions that occupy most of the element area.

As an element isolation region forming method, an STI technique for filling insulating films into trenches formed by anisotropic etching is used. With the present STI technique, a filling process is performed by use of silicon oxide films formed by a high density plasma (HDP) assisted-chemical vapor deposition (CVD) method. However, it becomes more difficult to perform the filling process by use of the silicon oxide films by the HDP-CVD method as the miniaturization is further advanced. This is because openings are more frequently closed by formation of overhang films when the STI width becomes less than 30 nm although the HDP-CVD method is originally a highly anisotropic film formation method.

Therefore, recently, use of an insulating film such as a spin on glass (SOG) film, TEOS/$O_3$ film or chemical vapor condensation film having fluidity at the filling time of or at the heat treatment time as the STI filling material is studied (see Jpn. Pat. Appln. KOKAI Publication No. 2001-319927, Japanese Patent Publication No. 3178412).

However, since the above insulating films having fluidity generally have low film density and exhibit large film condensation, they tend to cause high tensile stress in an element region. Therefore, there occurs a problem that occurrence of crystal defects and deformation of the element region may be caused due to the stress applied to the active area.

BRIEF SUMMARY OF THE INVENTION

According to one aspect of the present invention, there is provided a nonvolatile semiconductor memory device which includes a substrate, a nonvolatile memory cell portion formed on the substrate, a low-voltage operating circuit portion of a peripheral circuit region formed on the substrate, a high-voltage operating circuit portion of the peripheral circuit region formed on the substrate, and a filling insulating film formed to isolate the above portions, wherein an upper surface of part of the filling insulating film in the high-voltage operating circuit portion lies above a surface of the substrate and an upper surface of at least part of the filling insulating film in the low-voltage operating circuit portion is pulled back to a portion lower than the surface of the substrate.

According to another aspect of the present invention, there is provided a manufacturing method of a nonvolatile semiconductor memory device which includes forming element isolation trenches in a surface portion of a substrate to isolate a nonvolatile memory cell portion, a low-voltage operating circuit portion of a peripheral circuit region and a high-voltage operating circuit portion of the peripheral circuit region from one another, filling an insulating film having fluidity into the element isolation trenches to form filling insulating films and setting an upper surface of the filling insulating film to a preset height portion higher than a surface of the substrate, setting the upper surfaces of the filling insulating film in the memory cell portion and the filling insulating film in the low-voltage operating circuit portion to a portion lower than the upper portion of the filling insulating film in the high-voltage operating circuit portion by simultaneously etching back the filling insulating film in the memory cell portion and the filling insulating film in the low-voltage operating circuit portion, and setting the upper surface of at least part of the filling insulating film in the low-voltage operating circuit portion to a portion lower than the upper surface of the filling insulating film in the memory cell portion and lower than the surface of the substrate by etching back at least part of the filling insulating film in the low-voltage operating circuit portion.

According to a further aspect of the present invention, there is provided a manufacturing method of a nonvolatile semiconductor memory device which includes forming element isolation trenches in a surface portion of a substrate to isolate a nonvolatile memory cell portion, a low-voltage operating circuit portion of a peripheral circuit region and a high-voltage operating circuit portion of the peripheral circuit region from one another, filling an insulating film having fluidity into the element isolation trenches to form filling insulating films and setting an upper surface of the filling insulating film to a preset height portion higher than a surface of the substrate, forming gate electrodes of transistors in the low-voltage operating circuit portion, forming an ion-implantation mask for formation of source/drain regions of the transistors in the low-voltage operating circuit portion, ion-implanting impurities into the source/drain regions of the transistors in the low-voltage operating circuit portion by use of the mask, and etching back the filling insulating film in the low-voltage operating circuit portion to a portion lower than the surface of the substrate by use of the mask.

BRIEF DESCRIPTION OF THE SEVERAL VIEWS OF THE DRAWING

FIGS. 1A and 1B are cross-sectional views showing a manufacturing step of a flash memory according to a first embodiment of this invention.

FIGS. 2A and 2B are cross-sectional views showing a manufacturing step of the flash memory according to the first embodiment.

FIGS. 5A and 5B are cross-sectional views showing a manufacturing step of the flash memory according to the first embodiment.

FIGS. 6A and 6B are cross-sectional views showing a manufacturing step of the flash memory according to the first embodiment.

FIGS. 7A and 7B are cross-sectional views showing a manufacturing step of the flash memory according to the first embodiment.

FIGS. 9A and 9B are cross-sectional views showing a manufacturing step of a flash memory according to a second embodiment.

FIGS. 10A and 10B are cross-sectional views showing a manufacturing step of the flash memory according to the second embodiment.

FIGS. 11A and 11B are cross-sectional views showing a manufacturing step of the flash memory according to the second embodiment.

FIGS. 12A and 12B are cross-sectional views showing a manufacturing step of the flash memory according to the second embodiment.

FIGS. 13A and 13B are cross-sectional views showing a manufacturing step of the flash memory according to the second embodiment.

FIGS. 14A and 14B are cross-sectional views showing a manufacturing step of the flash memory according to the second embodiment.

FIGS. 15A and 15B are cross-sectional views showing a manufacturing step of a flash memory according to a third embodiment.

FIGS. 16A and 16B are cross-sectional views showing a manufacturing step of the flash memory according to the third embodiment.

FIGS. 17A and 17B are cross-sectional views showing a manufacturing step of the flash memory according to the third embodiment.

FIGS. 18A and 18B are cross-sectional views showing a manufacturing step of the flash memory according to the third embodiment.

FIGS. 19A and 19B are cross-sectional views showing a manufacturing step of the flash memory according to the third embodiment.

FIGS. 20A and 20B are cross-sectional views showing a manufacturing step of the flash memory according to the third embodiment.

DETAILED DESCRIPTION OF THE INVENTION

Figure 3A:
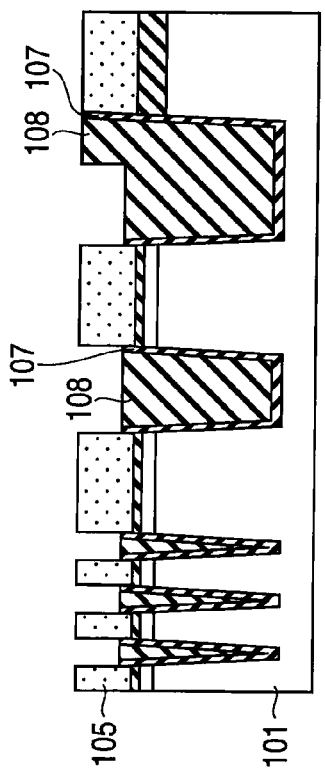
FIGS. 3A and 3B are cross-sectional views showing a manufacturing step of the flash memory according to the first embodiment.

There will now be described embodiments of this invention in detail with reference to the accompanying drawings.

First Embodiment

FIGS. 1A and 1B to FIGS. 7A and 7B are cross-sectional views showing manufacturing steps of a flash memory according to a first embodiment of this invention. FIGS. 1A to 7A are cross-sectional views in the bit line direction and FIGS. 1B to 7B are cross-sectional views in the word line direction.

The present embodiment shows an example of a floating gate flash memory. Particularly, an example of the flash memory is shown that is formed in a case where a gate insulating film and a gate electrode film used as a floating gate are previously and sequentially formed on a semiconductor substrate, then STI regions are formed and a polysilazane film that is one type of SOG film is filled into the STI regions.

First, as shown in FIGS. 1A and 1B, a well and channel region 102 are formed by ion-implanting impurities into a semiconductor substrate 101 of silicon or the like. In the following explanation, only a case of an n channel is explained in detail for simplifying the explanation, but the manufacturing process itself is the same in a case of a p channel. A high-voltage operating circuit portion in a peripheral circuit region is recessed by approximately 25 nm by use of a known lithography technique and reactive ion etching (RIE) technique. Then, a silicon thermal oxide film used as a gate insulating film of the high-voltage operating circuit portion is formed to 30 nm on the entire surface of the substrate. Further, the silicon thermal oxide film lying on a portion other than the high-voltage operating circuit portion of the peripheral circuit region is removed by use of a known lithography technique and wet etching technique.

Next, a silicon thermal oxynitride film is formed to a thickness of 8 nm. Thus, a gate insulating film 103 formed of the silicon thermal oxynitride film is formed on a tunnel insulating film region of a cell portion and a low-voltage operating circuit portion of the peripheral circuit region. At the same time, a gate insulating film 104 with the film thickness of 38 nm is formed in the high-voltage operating circuit portion of the peripheral circuit region. In this case, the upper surface of the gate insulating film 103 in the low-voltage operating circuit portion and the gate insulating film 103 in the high-voltage operating circuit portion are set at substantially the same height. After this, a first P-doped polysilicon film 105 used as part of the gate electrode of the peripheral circuit region and floating gate is formed to a thickness of 70 nm and a silicon nitride film 106 used as a polishing stopper of a chemical mechanical polishing (CM) process is formed to a thickness of 50 nm.

Next, as shown in FIGS. 2A and 2B, the silicon nitride film 106, P-doped polysilicon film 105, silicon thermal oxynitride film 103, gate insulating film 104 and semiconductor substrate 101 are sequentially processed by use of a normal lithography technique and RIE technique to form element isolation trenches with the etching depth of 220 nm in the semiconductor substrate 101. Then, an O$_3$/TEOS film 107 is formed to a thickness of 20 nm on the entire surface of the substrate and a polysilazane film 108 is formed as an SOG film. The polysilazane film 108 is formed as follows.

A perhydrosilazane polymer [(SiH$_2$NH)n] with a mean molecular weight of 3000 to 6000 is dissolved into xylene, dibutylether or the like to form a perhydrosilazane polymer solution. The perhydrosilazane polymer solution is coated on the surface of the semiconductor substrate 101 by a spin coating method. In this case, since the liquid is coated, the perhydrosilazane polymer is filled in the internal portions of narrow element isolation trenches without causing voids (unfilled) or seams (joint-shaped unfilled portions). For example, the condition of the spin coating method is so set that the rotation speed of the semiconductor substrate 101 will be 1200 rpm, the rotation time will be 30 seconds, a drop amount of the perhydrosilazane polymer solution will be 2 cc and the target coating film thickness immediately after baking will be 450 nm.

Next, the semiconductor substrate 101 having the coating film formed thereon is heated to 150° C. on a hot plate and baked for three minutes in an inert gas atmosphere to evaporate a solvent in the perhydrosilazane polymer solution. In this state, carbon or hydrocarbon caused by the solvent remains in the coating film as impurities at approximately several % to ten-odd %. Further, in this state, the perhydrosilazane polymer film is set to a state that is closer to the state of a silicon nitride film containing the remaining solvent and having low density.

The perhydrosilazane polymer film is subjected to a low-pressure steam oxidation process of 250° C., 400 Torr and 30 min. After this, the temperature of the film is raised to 530° C. while the steam is caused to flow and a low-pressure steam oxidation process is performed for 20 min to remove C, N remaining in the film. Further, an annealing process is performed in an inert gas atmosphere of 800° C. to 1000° C. to enhance the density of the polysilazane film 108.

Next, the polysilazane film 108 and $O_3$/TEOS film 107 are made flat by use of a CMP technique and left behind only in the element isolation trenches. After this, the STI structures (107, 108) on the entire surface of the substrate are recessed by approximately 50 nm by use of a reactive ion etching technique. Thus, the STI structure in the high-voltage operating circuit portion of the peripheral circuit region is formed.

Figure 3B:
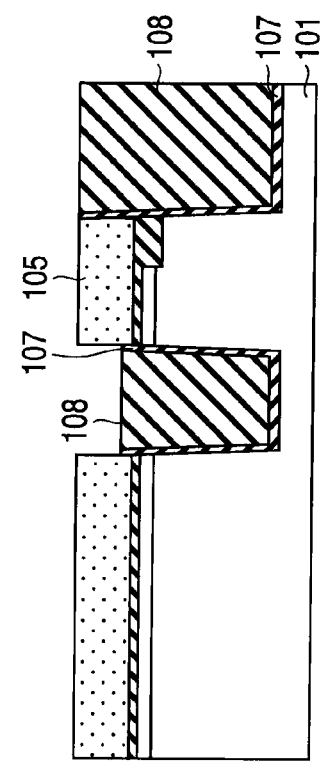

Next, as shown in FIGS. 3A and 3B, the STI structures (107, 108) in the low-voltage operating circuit portion of the peripheral circuit region and cell portion are recessed by approximately 40 nm by use of a reactive ion etching technique with the high-voltage operating circuit portion masked by a known lithography technique. In the present embodiment, the recessing process is performed by use of the reactive ion etching technique, but can be performed by use of a wet etching technique. Further, the silicon nitride film 106 is removed by use of hot phosphoric acid. Thus, the STI structures in the low-voltage operating circuit portion of the peripheral circuit region and cell portion are formed.

Figure 4A:
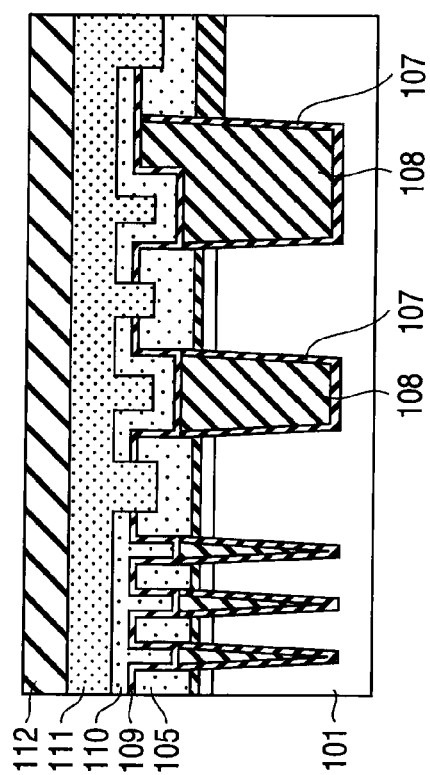
FIGS. 4A and 4B are cross-sectional views showing a manufacturing step of the flash memory according to the first embodiment.
Figure 4B:
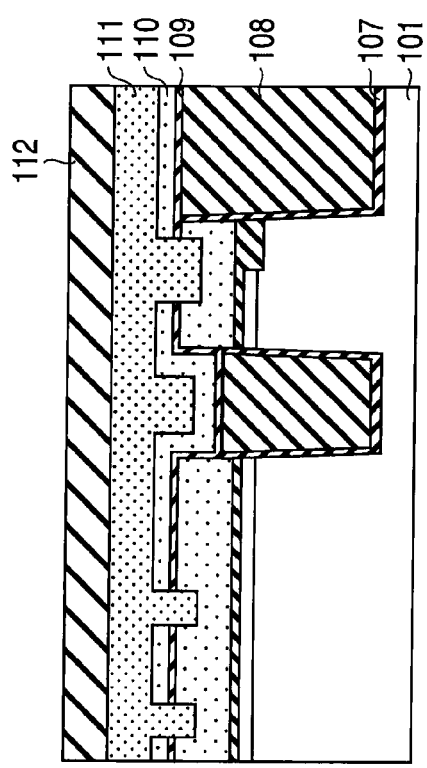

Next, as shown in FIGS. 4A and 4B, an ONO film 109 used as an inter-polysilicon gate electrodes dielectric film (IPD) is formed. Further, a second P-doped polysilicon film 110 used as control gate electrodes is formed to a thickness of 40 nm. Then, openings are formed in the P-doped polysilicon film 110 and ONO film 109 of the peripheral circuit portion by use of the known lithography technique and RIE technique. After this, a third P-doped polysilicon film 111 is formed on the entire surface of the substrate and then a silicon nitride film 112 is formed thereon.

Next, as shown in FIGS. 5A and 5B, the silicon nitride film 112, P-doped polysilicon films 111, 110, ONO film 109 and P-doped polysilicon film 105 are sequentially processed by use of the known lithography technique and RIE technique to form control gate electrodes and floating gate electrodes of the memory cell portion and gate electrodes in the peripheral circuit region. At this time, an over-etching process is performed at the gate electrode processing time to set the upper surfaces of the STI structures in the low-voltage operating circuit portion lower than the surface of the semiconductor substrate 101.

Next, as shown in FIGS. 6A and 6B, LDD regions (not shown) of transistors are formed by use of the known lithography technique and ion-implantation technique. Further, spacer films 113 are formed on the side surfaces of the control gate electrodes and floating gate electrodes of the memory cell portion and the side surfaces of the gate electrodes of the peripheral circuit portion. Specifically, a silicon oxide film is formed on the entire surface by use of the low-pressure (LP)-CVD method and etched back to leave the silicon oxide films only on the side surfaces, and as a result, the spacer films 113 are formed. After this, impurities are doped into source/drain regions 114 of transistors by use of the known lithography technique and ion-implantation technique. At this time, in the low-voltage operating circuit portion in which ion-implantation with high impurity concentration (As in the n channel and $BF_2$ in the p channel) is performed, the source/drain regions are formed into an amorphous form.

In the present embodiment, two cases, including a case wherein the STI structure is recessed to a position lower than the source/drain regions formed into the amorphous form and a case wherein the STI structure is recessed to a position lower than the surface of the semiconductor substrate and partly formed in contact with the source/drain regions 114 formed into the amorphous form are considered by changing the over-etching condition at the gate electrode processing time. Then, the source/drain regions 114 formed into the amorphous form are re-crystallized by performing a recovery annealing process to form diffusion layers.

Next, as shown in FIGS. 7A and 7B, a silicon nitride film 115 is formed on the entire surface of the substrate and then an $O_3$/TEOS film 116 is further formed as a pre-metal dielectric (PMD) film on the entire surface. Then, the substrate surface is made flat by use of a CMP method with the silicon nitride films 115, 112 used as a stopper and then the silicon nitride films 115, 112 are removed. After this, the gate electrodes are silicided to form nickel silicide electrodes 117 and then a silicon nitride film 118 is formed as a protection film.

In the process after the above step, a multi-layered interconnection process of forming inter-layer dielectric films (ILD) 119, 120, 121, 122 and forming interconnection layers 123, 124, 125 and contact plugs 126, 127, 128 is performed. In this case, a detailed explanation thereof is omitted and only the final structure of the device is shown.

In order to show the effect of the present embodiment, the difference in junction leak currents is shown below (Table 1). A case (A) wherein the etch-back process of the STI structure is performed only in the cell portion as in the conventional case, a case (C) wherein the STI structure is recessed to a position lower than the source/drain regions formed into the amorphous form as described above and a case (B) wherein the STI structure is recessed to a position lower than the surface of the semiconductor substrate and partly formed in contact with the source/drain regions formed into the amorphous form are compared.

TABLE 1

| | n-channel junction leak | number of etched pits in n-type Tr diffusion layer | p-channel junction leak | number of etched pits in p-type Tr diffusion layer |
| --- | --- | --- | --- | --- |
| A | 1.3 pA/$\mu m^2$ | 18/$cm^2$ | 1.5 pA/$\mu m^2$ | 56/$cm^2$ |
| B | 0.18 pA/$\mu m^2$ | 0.8/$cm^2$ | 0.23 pA/$\mu m^2$ | 1.3/$cm^2$ |
| C | 0.01 pA/$\mu m^2$ | 0/$cm^2$ | 0.02 pA/$\mu m^2$ | 0/$cm^2$ |

As is understood from Table 1, the junction leak current is reduced in the cases (B) and (C) in comparison with the case (A), and the case (C) is excellent in comparison with the case (B). Further, as shown in Table 1, it is understood that the number of etched pits becomes minimum in the case (C) when the numbers of crystal defects are compared based on the numbers of etched pits obtained after the Wright etching process (the process of etching crystal defects into a pit form in a mixture of an oxidizing agent ($CrO_3$, $K_2Cr_2O_7$, $HNO_3$) and HF).

Figure 8:
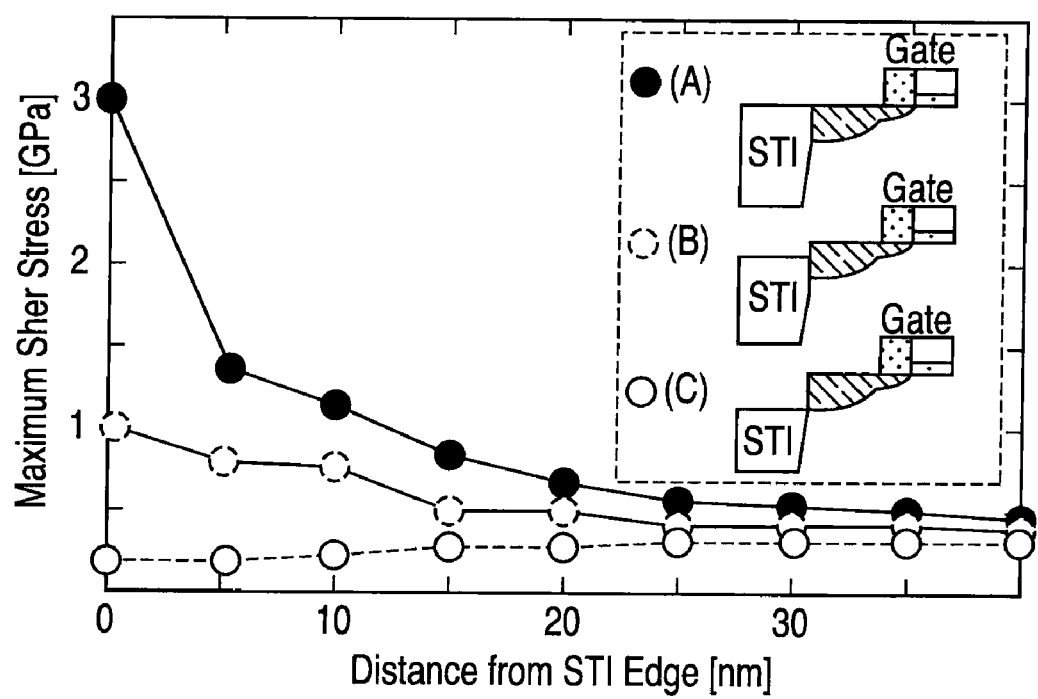
FIG. 8 is a diagram showing the result of calculation of the maximum shearing stress applied to an active region by simulation.

In FIG. 8, the results of calculation of the maximum shear stress applied to the active area by simulation for the structures in the cases (A), (B) and (C) are shown. It is understood that the stress applied from the STI structure to the active area becomes lower in the order of the cases (A), (B) and (C).

In the present embodiment, the polysilazane film is used as the filling insulating film 108 for the STI structure, but another type of SOG film, such as a hydrogen silises quioxane (HSQ: $(HSiO_{3/2})_n$) film or $O_3$/TEOS film can be used to fill the STI portions.

Thus, according to the present embodiment, when the height of the STI portion is adjusted after the STI filling process is performed, the STI height in the low-voltage operating circuit portion of the peripheral circuit region is reduced to substantially the same height as that of the STI portion in the cell portion and the STI filling insulating film lying near the source/drain region of the transistor in the low-voltage operating circuit portion is pulled back to a portion lower than the substrate surface. As a result, occurrence of crystal defects at the time of formation of source/drain regions in the low-voltage operating circuit portion can be suppressed. Therefore, even if an insulating film having fluidity is filled into a minute STI portion, deterioration in the characteristic of the transistor of the peripheral circuit portion can be suppressed and the performance and bit density can be enhanced by further scale-down of the flash memory.

That is, by forming the structure in which the upper surface of at least part of the STI filling insulating film in the low-voltage operating circuit portion is pulled back to a position lower than the substrate surface, occurrence of crystal defects caused by applying stress due to STI can be suppressed and the bit density and reliability can be enhanced.

In this case, generally, the source/drain region in the low-voltage operating circuit portion of the flash memory is temporarily formed into an amorphous form by ion-implantation with a high impurity concentration. Therefore, if a strong tensile stress caused by the STI portion is applied at the annealing time for activation, crystal defects occur from the end portion of the active area and junction leaks will be increased in some cases. On the other hand, in the present embodiment, since the STI filling insulating film is pulled back to a position lower than the region that is formed into an amorphous form by ion-implantation, occurrence of crystal defects in the low-voltage operating circuit portion can be prevented.

Further, since the STI filling insulating film is pulled back to a position lower than the source/drain region (that is formed into an amorphous form) only in the low-voltage operating circuit portion, the withstand voltage in the high-voltage operating circuit portion can be kept sufficiently high. In addition, an advantage that a measure against occurrence of crystal defects due to STI stress can be taken without greatly increasing the number of manufacturing steps of the present flash memory can be attained.

An over-etching process is performed at the time of formation of gate electrodes in order to pull back the STI filling insulating films lying near the source/drain regions of the transistors in the low-voltage operating circuit portion to a portion lower than the substrate surface. Therefore, an advantage that it is not necessary to additionally provide a lithography step and processing step to pull back the filling insulating film is attained.

Second Embodiment

FIGS. 9A and 9B to FIGS. 14A and 14B are cross-sectional views showing manufacturing steps of a flash memory according to a second embodiment of this invention. FIGS. 9A to 14A are cross-sectional views in the bit line direction and FIGS. 9B to 14B are cross-sectional views in the word line direction.

The present embodiment also shows an example of a floating gate flash memory. Particularly, in this example, $O_3$/TEOS films are filled into STI portions and FG is formed by use of CMP.

First, like the first embodiment, as shown in FIGS. 9A and 9B, after a well and channel region 202 are formed on a semiconductor substrate 201, a high-voltage operating circuit portion in a peripheral circuit region is recessed by approximately 25 nm. Then, a silicon thermal oxide film used as a gate insulating film of the high-voltage operating circuit portion is formed to 30 nm on the entire surface of the substrate. Further, the silicon thermal oxide film lying on a portion other than the high-voltage operating circuit portion of the peripheral circuit region is removed.

Next, like the first embodiment, a silicon thermal oxynitride film 203 used as a tunnel insulating film region of a cell portion and gate insulating films of a low-voltage operating circuit portion of the peripheral circuit region is formed to a thickness of 8 nm. Thus, a gate insulating film 204 with a film thickness of 38 nm is formed in the high-voltage operating circuit portion of the peripheral circuit region. Further, a first P-doped polysilicon film 205 used as part of the gate electrodes of the peripheral circuit region and floating gates is formed to a thickness of 30 nm and a silicon nitride film 206 used as a polishing stopper of a CMP process is formed to a thickness of 60 nm. After this, the silicon nitride film 206, P-doped polysilicon film 205, silicon thermal oxynitride film 203, gate insulating film 204 and semiconductor substrate 201 are sequentially processed to form element isolation trenches with the etching depth of 220 nm in the semiconductor substrate.

Then, the silicon nitride film 206 is pulled back by 10 nm in hot phosphoric acid. That is, the edge portion of the silicon nitride film 206 is pulled back by 10 nm by processing the silicon nitride film 206 in hot phosphoric acid. Then, an $O_3$/TEOS film 207 is formed to a sufficiently large thickness of 600 nm on the entire surface of the substrate and the heat treatment is performed in nitrogen of 900° C. to enhance the film density thereof.

Next, as shown in FIGS. 10A and 10B, the $O_3$/TEOS film 207 is made flat by use of a CMP technique and left behind only in the element isolation trenches. After this, the silicon nitride film 206 is removed by use of hot phosphoric acid. Then, the $O_3$/TEOS film 207 is pulled back by 10 nm by an etching process using a hydrofluoric acid series and, at the same time, the oxide films on the surfaces of the P-doped polysilicon films 205 are removed. After this, a second P-doped polysilicon film 208 is deposited and is then made flat by a CMP process with the $O_3$/TEOS films 207 used as a stopper to form floating gates. Thus, the STI structures in the high-voltage operating circuit portion of the peripheral circuit region are formed.

Next, like the first embodiment, as shown in FIGS. 11A and 11B, the STI structures of the low-voltage operating circuit portion of the peripheral circuit region and cell portion are recessed by approximately 40 nm. Thus, the STI structures of the low-voltage operating circuit portion of the peripheral circuit region and cell portion are formed.

Next, like the first embodiment, as shown in FIGS. 12A and 12B, an ONO film 209 used as an inter-polysilicon gate electrodes dielectric film (IPD) is formed, a third P-doped polysilicon film 210 used as control gate electrodes is formed to a thickness of 40 nm and then openings are formed in the P-doped polysilicon film 210 and ONO film 209 of the peripheral circuit portion. After this, a fourth P-doped polysilicon film 211 is formed on the entire surface of the substrate and then a silicon nitride film 212 is formed.

Next, like the first embodiment, as shown in FIGS. 13A and 13B, the silicon nitride film 212, P-doped polysilicon films 211, 210, ONO film 209 and P-doped polysilicon films 208, 205 are sequentially processed to form control gate electrodes and floating gate electrodes of the memory cell portion and gate electrodes of the peripheral circuit region. At this time, an over-etching process is performed at the gate electrode processing time to set the upper surface of the STI structure in the low-voltage operating circuit portion lower than the surface of the semiconductor substrate 201.

Next, like the first embodiment, as shown in FIGS. 14A and 14B, LDD regions of transistors are formed and silicon oxide film spacer films 213 are formed on the side surfaces of the control gate electrodes and floating gate electrodes of the memory cell portion and the side surfaces of the gate electrodes of the peripheral circuit portion. After this, impurities are doped into source/drain regions 214 of the transistors. At this time, in the low-voltage operating circuit portion in which ion-implantation with high impurity concentration (As in the n channel and $BF_2$ in the p channel) is performed, the source/drain regions are formed into an amorphous form. Then, a recovery annealing process is performed to re-crystallize the source/drain regions 214 that are formed into the amorphous form and thus diffusion layers are formed.

Next, like the first embodiment, a silicon nitride film 215 is formed on the entire surface of the substrate, a BPSG film 216 is formed as a PMD film on the entire surface and made flat and then the silicon nitride films 215, 212 are removed. After this, the gate electrodes are silicided to form nickel silicide electrodes 217 and then a silicon nitride film 218 is formed as a protection film. In the process after the above step, a multi-layered interconnection process of forming inter-layer dielectric films (ILD) 219, 220, 221, 222 and forming interconnection layers 223, 224, 225 and contact plugs 226, 227, 228 is performed.

In the present embodiment, the $O_3$/TEOS film is used as the STI filling insulating film, but an SOG film or condensed CVD film can be used to fill the STI portion like the first embodiment.

Also, in the case of the present embodiment, the crystal defects are evaluated by use of the Wright etching process like the first embodiment and it is confirmed that almost no crystal defects are present. Further, it is confirmed that the junction currents in both of the n channel and p channel are set to a sufficiently small value of 0.1 pA/$\mu m^2$ or less. Therefore, the same effect as that of the first embodiment can be attained.

Third Embodiment

FIGS. 15A and 15B to FIGS. 20A and 20B are cross-sectional views showing manufacturing steps of a flash memory according to a third embodiment of this invention. FIGS. 15A to 20A are cross-sectional views in the bit line direction and FIGS. 15B to 20B are cross-sectional views in the word line direction.

The present embodiment shows an example of a charge trap flash (CTF) memory. In this example, a case wherein STI structures are formed after previously forming a silicon nitride film and alumina film used as a tunnel insulating film and charge storage layer and a polysilicon film used as part of a control gate electrode on a semiconductor substrate is explained. In the case of a CTF structure, since a step of recessing cell STI portions is not performed, the STI portions are recessed by a reactive ion etching process after ion-implantation in the low-voltage operating circuit portion of the peripheral circuit region.

First, like the first embodiment, as shown in FIGS. 15A and 15B, after a well and channel region 302 are formed on a semiconductor substrate 301, a high-voltage operating circuit portion in a peripheral circuit region is recessed by approximately 25 nm and a silicon thermal oxide film used as a gate insulating film of the high-voltage operating circuit portion is formed to 30 nm on the entire surface of the substrate. Further, the silicon thermal oxide film lying on a portion other than the high-voltage operating circuit portion of the peripheral circuit region is removed.

Next, a gate insulating film 304 of 38 nm is formed in the high-voltage operating circuit portion of the peripheral circuit region by forming a silicon thermal oxide film 303 used as gate insulating films of a low-voltage operating circuit portion of the peripheral circuit region to 6 nm. Further, a first P-doped polysilicon film 305 is formed on the entire surface of the substrate. Then, the silicon thermal oxide film 303 and P-doped polysilicon film 305 in the cell portion are removed by use of a known lithography technique and etching technique. After this, a silicon thermal oxynitride film 356 used as a tunnel insulating film is formed and a silicon nitride film 357 used as a memory storage film and an alumina film 358 are formed by use of an LP-CVD method and atomic layer deposition (ALD) method. Then, a second P-doped polysilicon film 359 used as part of gate electrodes is formed to a thickness of 40 nm and a silicon nitride film 360 used as a polishing stopper of a CMP process is formed to a thickness of 50 nm.

After this, as shown in FIGS. 16A and 16B, the silicon nitride film 360, P-doped polysilicon film 359, alumina film 358, silicon nitride film 357, silicon thermal oxynitride film 356, gate insulating film 304, silicon thermal oxide film 303 and semiconductor substrate 301 are sequentially processed by use of a normal lithography technique and normal reactive ion etching technique to form element isolation trenches with the etching depth of 240 nm in the semiconductor substrate. Then, like the first embodiment, an $O_3$/TEOS film 307 is formed to 10 nm on the entire surface of the substrate. After this, a polysilazane film 308 is formed to a thickness of 500 nm and is filled into the element isolation trenches. The polysilazane film forming method is the same as that of the first embodiment. Then, the density of the polysilazane film 308 is enhanced by performing an annealing process in an inert gas atmosphere at a temperature of 800° C. to 1000° C.

Next, the $O_3$/TEOS film 307 and polysilazane film 308 are made flat by use of a CMP technique and left behind only in the element isolation trenches. After this, the silicon nitride film 360 is removed by an etching process using hot phosphoric acid. Then, the $O_3$/TEOS film 307 and polysilazane film 308 in the element isolation trenches are recessed by approximately 50 nm on the entire surface of the substrate by reactive ion etching. Thus, the STI structures in the high-voltage operating circuit portion of the peripheral circuit region and in the low-voltage operating circuit portion of the peripheral circuit region and cell portion are formed.

Next, as shown in FIGS. 17A and 17B, the P-doped polysilicon film 359, alumina film 358, silicon nitride film 357 and silicon thermal oxynitride film 356 on the peripheral circuit portion are removed by use of a normal lithography technique and RIE technique. After this, a third P-doped polysilicon film 363 used as control gate electrodes is formed to 200 nm and then a silicon nitride film 364 is formed.

Next, as shown in FIGS. 18A and 18B, the silicon nitride film 364, P-doped polysilicon film 363, P-doped polysilicon film 359, alumina film 358 and silicon nitride film 357 are sequentially processed by use of the known lithography technique and RIE technique to form control gate electrodes and gate electrodes of the peripheral circuit portion. At this time, the upper surface of the STI structure in the low-voltage operating circuit portion of the peripheral circuit region is lowered to a portion that lies near the surface of the semiconductor substrate 301 by performing an over-etching process at the gate electrode processing time.

Next, as shown in FIGS. 19A and 19B, LDD regions of transistors are formed by use of the known lithography technique and ion-implantation technique. Further, silicon oxide films are formed on the side surfaces of the control gate electrodes and the gate electrodes of the peripheral circuit portion by an LP-CVD method and etched back to form spacer insulating films 365. Then, impurities are doped into source/drain regions 314 of n-channel transistors by use of the known lithography technique and ion-implantation technique. A symbol 367 in FIG. 19A denotes a mask for ion implantation. At this time, the source/drain regions in the low-voltage operating circuit portion in which the ion-implantation process with high impurity concentration (As in the n channel and $BF_2$ in the p channel) is performed are formed into an amorphous form.

Next, the upper surface of the STI structure of the low-voltage operating circuit portion of the peripheral circuit region is etched back from the substrate surface by a reactive ion etching process with the ion-implantation mask 367 left behind and is set deeper than the source/drain regions formed into the amorphous form. In the present embodiment, the etch-back process is performed by using the reactive ion etching process, but the etch-back process can be performed by using a wet etching process in a condition in which the selective ratio of etching for the STI filling insulating film and the spacer insulating film 365 can be set sufficiently high.

Likewise, in p-channel transistors in the low-voltage operating circuit portion of the peripheral circuit region, the STI structures in the low-voltage operating circuit portion of the peripheral circuit region are pulled back to become deeper than the source/drain regions by ion-implantation of impurities into the source/drain regions and the etch-back process using the ion-implantation mask. Then, a recovery annealing process is performed to re-crystallize the source/drain regions 314 that are formed into the amorphous form and thus diffusion layers are formed.

Next, like the first embodiment, as shown in FIGS. 20A and 20B, a silicon nitride film 315 is formed on the entire surface of the substrate and a BPSG film 316 is formed as a PMD film on the entire surface and then made flat. After this, the silicon nitride film 315 is removed and gate electrodes are silicided to form nickel-platinum silicide electrodes 317. Next, a silicon nitride film 318 is formed on the entire surface of the substrate. In the succeeding process, a multi-layered interconnection process of forming inter-layer dielectric films (ILD) 319, 320, 327, 328 and forming interconnection layers 323, 324, 325 and contact plugs 326, 327, 328 is performed.

In the present embodiment, an example of the MONOS of the alumina film/nitride film/silicon oxynitride film type is shown, but this invention can be applied to a MONOS using a high-k film such as HfAlO, HfSiO film instead of the alumina film or nitride film or a storage layer formed of silicon nano-crystal.

In the case of the present embodiment, the crystal defects are evaluated by use of the Wright etching process like the first embodiment and it is confirmed that almost no crystal defects are present. Further, it is confirmed that the junction leakage currents in both of the n channel and p channel are set to a sufficiently small value of 0.1 $pA/\mu m^2$ or less. Therefore, the same effect as that of the first embodiment can be attained. Further, an advantage that it is not necessary to additionally provide a mask for pulling back the filling insulating film by using the mask for ion implantation in order to pull back the STI filling insulating film of the low-voltage operating circuit portion to a portion lower than the substrate surface can be provided.

(Modification)

This invention is not limited to the above embodiments. In the above embodiments, as the insulating film used to fill the STI structure, a polysilazane or $O_3$/TEOS film that is one type of SOG film is used. However, this invention is not limited to this case and an insulating film having fluidity can be used.

Further, in the above embodiments, the STI filling insulating film lying near the source/drain region of the transistor in the low-voltage operating circuit portion is pulled back to a portion deeper than the impurity doping region (amorphous region) by ion-implantation to form the source/drain region of the transistor. However, it may be pulled back to a portion lower than the substrate surface. As is understood from Table 1, this is because the effect that the number of etched pits can be reduced if it is pulled back to a portion lower than the substrate surface can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a nonvolatile semiconductor memory device comprising:

forming element isolation trenches in a surface portion of a substrate to isolate a nonvolatile memory cell portion, a low-voltage operating circuit portion of a peripheral circuit region and a high-voltage operating circuit portion of the peripheral circuit region from one another, filling an insulating film having fluidity into the element isolation trenches to form filling insulating films and setting an upper surface of the filling insulating film to a preset height portion higher than a surface of the substrate, setting the upper surfaces of the filling insulating film in the memory cell portion and the filling insulating film in the low-voltage operating circuit portion to a portion lower than the upper portion of the filling insulating film in the high-voltage operating circuit portion by simultaneously etching back the filling insulating film in the memory cell portion and the filling insulating film in the low-voltage operating circuit portion, and setting the upper surface of at least part of the filling insulating film in the low-voltage operating circuit portion to a portion lower than the upper surface of the filling insulating film in the memory cell portion and lower than the surface of the substrate by etching back at least part of the filling insulating film in the low-voltage operating circuit portion.

2. The method according to claim 1, wherein the filling insulating film lying near source/drain regions of transistors in the low-voltage operating circuit portion is etched back to a portion lower than the surface of the substrate by over-etching at the time of gate electrode processing of the transistors in the low-voltage operating circuit portion to set the upper surface of at least part of the filling insulating film in the low-voltage operating circuit portion to a portion lower than the surface of the substrate.

3. The method according to claim 2, wherein impurities are doped into source/drain regions of transistors in the low-voltage operating circuit portion to form the source/drain regions into an amorphous form after etching back the filling insulating film lying near source/drain regions of transistors in the low-voltage operating circuit portion and then a recovery annealing process is performed to re-crystallize the source/drain regions which are formed into the amorphous form.

4. The method according to claim 1, wherein one of a polysilazane film and $O_3$/TEOS film is used as the filling insulating film.

5. The method according to claim 1, wherein STI trenches are formed in the surface portion of the substrate by an anisotropic etching method to form the element isolation trenches.

6. The method according to claim 1, wherein a thin gate insulating film in the low-voltage operating circuit portion of the peripheral circuit region and a thick gate insulating film in the high-voltage operating circuit portion of the peripheral circuit region are previously formed on the surface portion of the substrate to set the upper surfaces of the gate insulating films to substantially the same height before forming the element isolation trenches.

7. The method according to claim 1, wherein gate electrodes of transistors are formed on the low-voltage operating circuit portion, a mask for ion-implantation to form source/drain regions of the transistors in the low-voltage operating circuit portion is formed, an ion-implantation process is performed with respect to the source/drain regions of the transistors in the low-voltage operating circuit portion by using the mask, and then the filling insulating film in the low-voltage operating circuit portion is etched back to become lower than the surface of the substrate by using the mask.

* * * * *